(12) United States Patent
Kim

(10) Patent No.: US 8,796,710 B2
(45) Date of Patent: Aug. 5, 2014

(54) LIGHT EMITTING DIODE PACKAGE

(75) Inventor: Bang Hyun Kim, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 178 days.

(21) Appl. No.: 13/113,662

(22) Filed: May 23, 2011

(65) Prior Publication Data

US 2011/0284900 A1 Nov. 24, 2011

(30) Foreign Application Priority Data

May 24, 2010 (KR) .................. 10-2010-0048117

(51) Int. Cl.
*H01L 33/00* (2010.01)
(52) U.S. Cl.
USPC .................................. 257/98; 257/99
(58) Field of Classification Search
USPC ............................ 257/98, 99
See application file for complete search history.

(56) References Cited

U.S. PATENT DOCUMENTS

2010/0181887 A1* 7/2010 Baek et al. ............... 313/45

* cited by examiner

*Primary Examiner* — Douglas Menz
(74) *Attorney, Agent, or Firm* — H.C. Park & Associates, PLC

(57) ABSTRACT

Exemplary embodiments of the present invention provide light emitting diode (LED) packages which include a housing configured to surround uplift portions formed on lead frames electrically connected to an LED chip. The LED package includes an LED chip, a first lead frame and a second lead frame electrically connected to the LED chip, the first lead frame and the second lead frame respectively including a first uplift portion and a second uplift portion on regions thereof facing each other, and a housing supporting the first lead frame and the second lead frame, a first side of the housing exposed to the outside. The first lead frame and the second lead frame each include a first side parallel to the first side of the housing and a second side opposite to the first side.

22 Claims, 4 Drawing Sheets (a)

(b)

(c)

(a)

(b)

(c)

LIGHT EMITTING DIODE PACKAGE

CROSS-REFERENCE TO RELATED APPLICATION

This application claims priority from and the benefit of Korean Patent Application No. 10-2010-0048117, filed on May 24, 2010, which is hereby incorporated by reference for all purposes as if fully set forth herein.

BACKGROUND OF THE INVENTION

1. Field of the Invention

Exemplary embodiments of the present invention relate to a light emitting diode (LED) package and, more particularly, to an LED package which includes a housing configured to surround uplift portions formed on lead frames electrically connected to an LED chip. The LED package is to increase a heat dissipation area while increasing physical strength between the lead frames and preventing moisture absorption.

2. Discussion of the Background

A light emitting diode (LED) is a semiconductor device that emits light through recombination of holes and electrons in a P-N junction between a P-type semiconductor and an N-type semiconductor. Such an LED may be manufactured as a package structure having an LED chip mounted therein.

A conventional LED package 1 includes first and second lead frames 11, 12 having a direct type heat dissipation structure. As shown in FIG. 1(a), one of the first and second lead frames 11, 12 separated from each other, for example the first lead frame 11, is formed with a hole-cup 111 by half-etching.

A housing 13 is formed to support the first and second lead frames 11, 12, and an LED chip 14 is mounted on the bottom of the hole-cup 111. As shown in FIG. 1(b), the housing 13 includes the hole-cup 111 and a cavity 131 which exposes portions of the first and second lead frames 11, 12. The housing 13 may be formed by, for example, polyphthalamide (PPA) injection or epoxy molding.

The LED chip 14 mounted in the hole-cup 111 is electrically connected to the second lead frame 12 via a bonding wire W. The hole-cup 111 is filled with a light-transmitting resin 16 containing at least one phosphor, and color uniformity of light emitted from the LED chip 14 can be enhanced by the phosphor in the hole-cup 111. An encapsulation material (not shown) may be disposed in the cavity 131 of the housing 13 to protect the LED chip 14 mounted in the hole-cup 111.

When electric power is applied to the lead frames 11, 12 of the LED package 1 from an external power source, the LED chip 14 is driven to emit light to the outside through the encapsulation material. Here, on a lower surface of the LED package shown in FIG. 1(c), the first lead frame 11 having the LED chip 14 mounted thereon and the second lead frame 12 are exposed outside, and may thereby enhance heat dissipation efficiency from the LED chip 14.

However, although the LED package 1 shown in FIG. 1 may have high heat dissipation efficiency, a portion dividing the first and second lead frames 11, 12 may have low physical strength and may be vulnerable to moisture, and the hole-cup 111 formed by half-etching may be non-uniform, thereby making it difficult to maintain uniformity of light generated from the LED chip 14. Further, when the hole-cup 111 is formed by etching, manufacturing costs of the package may increase, thereby limiting mass production.

A conventional LED package 2 developed to solve the problems of such a conventional LED package 1 having low physical strength and vulnerability to moisture includes first and second lead frames 21, 22 as shown in FIG. 2(a). Specifically, the first lead frame 21 includes a first horizontal section 21a, a protrusion 21b bent from the horizontal section 21a and protruding to a predetermined distance from the first horizontal section 21a, and a second horizontal section 21c bent and extending from the protrusion 21b. Further, the second lead frame 22 includes a third horizontal section 22a facing the first horizontal section 21a, a depression 22b bent from the third horizontal section 22a and depressed into the second lead frame 22, and a fourth horizontal section 22c bent from the depression 22b and facing the second horizontal section 21c. The protrusion 21b of the first lead frame 21 is disposed inside the depression 22b of the second lead frame 22.

Referring to FIG. 2(b), the LED package 2 has a housing 23 configured to support the first and second lead frames 21, 22 and having a cavity 231 exposing an LED chip 24. A bonding wire W and portions of the first and second lead frames 21, 22 are exposed through the cavity 231. The cavity 231 may be provided with an encapsulation material (not shown) to encapsulate the LED chip 24.

The first lead frame 21 includes a down-set portion 211 formed by stamping, and the LED chip 24 is mounted in the down-set portion 211. The down-set portion 211 is filled with a light-transmitting resin containing at least one phosphor. As shown in FIG. 2(c), a lower surface of the down-set portion 211 is coplanar with a lower surface of the LED package 2. In FIG. 2, the LED package 2 may have low heat dissipation efficiency from the LED chip 24 due to a narrow heat dissipation area, which corresponds to the lower surface of the down-set portion 211.

SUMMARY OF THE INVENTION

Exemplary embodiments of the invention provide an LED package which includes a housing configured to surround uplift portions formed on lead frames electrically connected to an LED chip. The LED package is to increase a heat dissipation area while increasing physical strength between the lead frames and preventing moisture absorption.

Additional features of the invention will be set forth in the description which follows and in part will be apparent from the description, or may be learned by practice of the invention.

An exemplary embodiment of the present invention discloses an LED package including an LED chip, a first lead frame and a second lead frame electrically connected to the LED chip, the first lead frame and the second lead frame respectively including a first uplift portion and a second uplift portion on facing regions thereof, and a housing supporting the first lead frame and the second lead frame, a first side of the housing exposed to the outside. The first lead frame and the second lead frame each include a first side parallel to the first side of the housing and a second side opposite to the first side.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
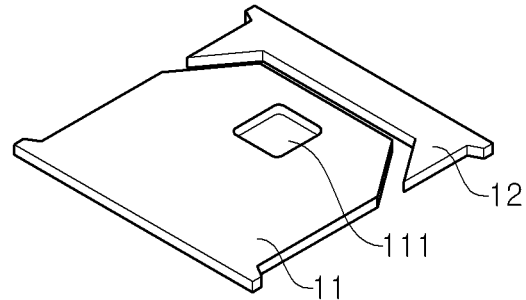
FIGS. 1 and 2 illustrate conventional LED packages.
Figure 1:
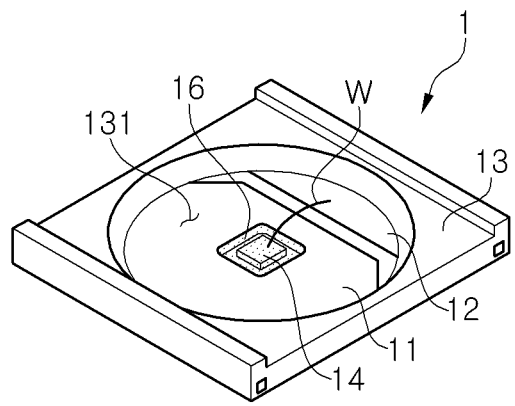
Figure 1:
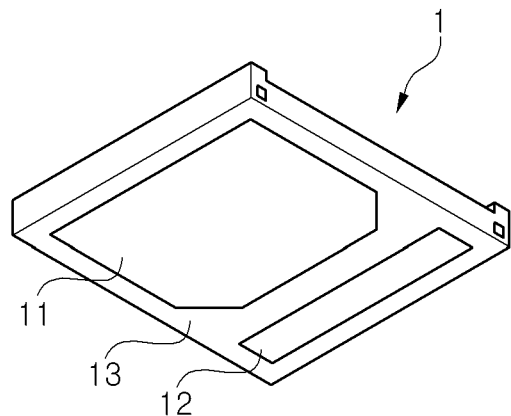
Figure 2:
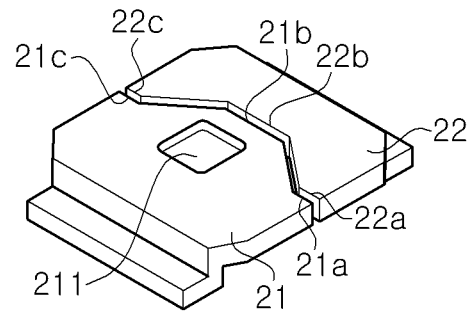
Figure 2:
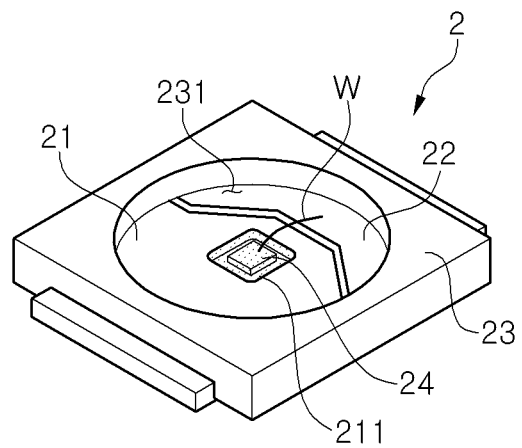
Figure 2:
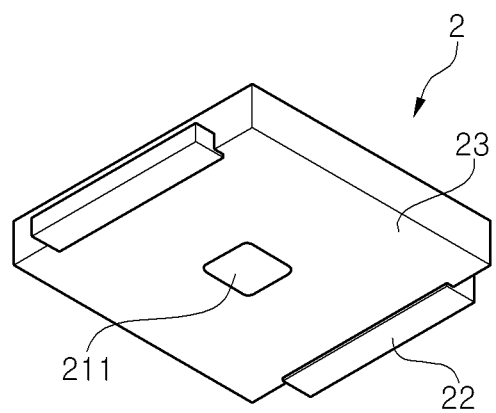

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, no intervening elements are present.

Figure 3:
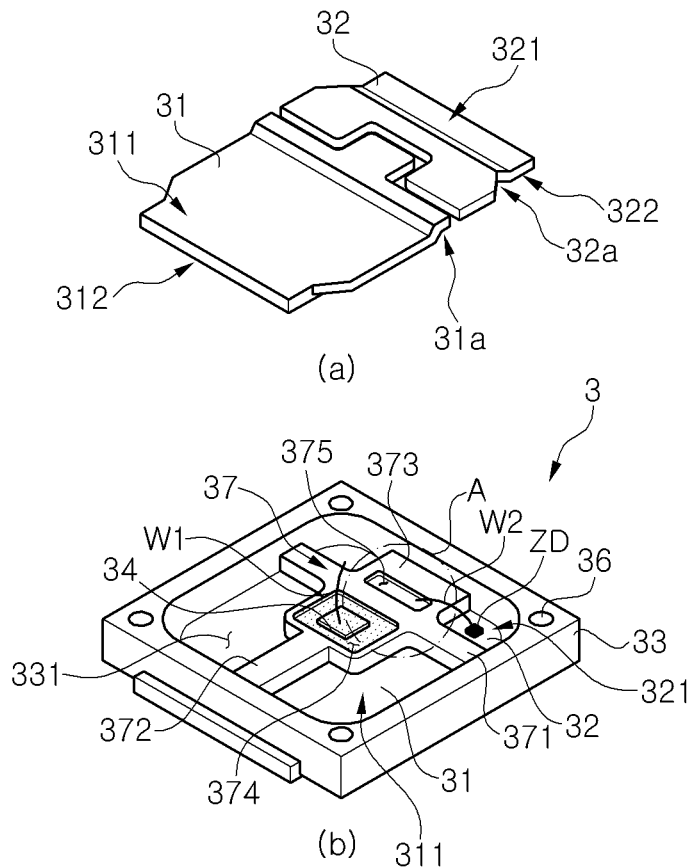
FIG. 3 illustrates an LED package according to an exemplary embodiment of the invention.
Figure 3:
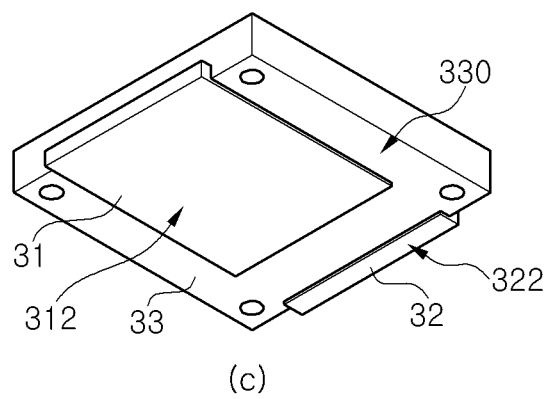
Figure 4:
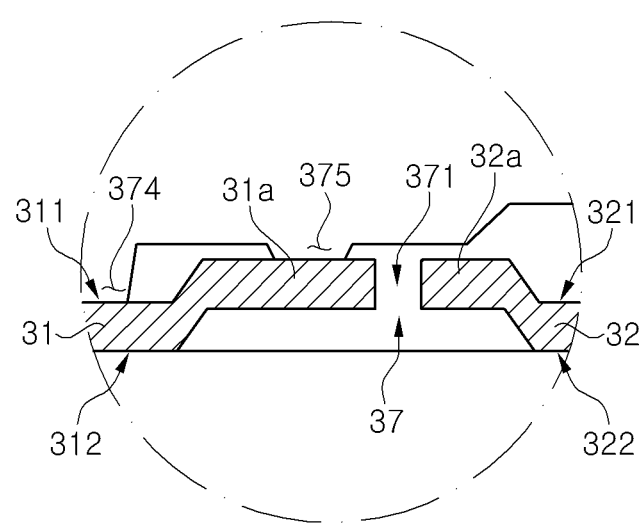
FIG. 4 is an enlarged cross-sectional view of circle A shown in FIG. 3.

FIG. 3 illustrates an LED package according to an exemplary embodiment of the invention, and FIG. 4 is an enlarged cross-sectional view of circle A shown in FIG. 3.

According to the present exemplary embodiment, an LED package 3 includes lead frames 31, 32, as shown in FIG. 3(a).

Referring to FIG. 3(a), the lead frames 31, 32 are separated from each other.

The lead frames 31, 32 include uplift portions 31a, 32a respectively formed at adjacent portions thereof. The uplift portions 31a, 32a may be formed by stamping a substantially flat metal plate using, for example, a punch, such that portions of the metal plate respectively corresponding to an anode and a cathode are raised relatively higher than the rest of the lead frames 31 and 32.

Further, the lead frames 31, 32 are disposed to face each other. More specifically, a portion of the uplift portion 31a of the first lead frame 31 is disposed in a depressed area in the uplift portion 32a of the second lead frame 32.

Referring to FIG. 3(b), the LED package 3 according to the present exemplary embodiment includes a housing which supports the first and second lead frames 31, 32 while surrounding the uplift portions 31a, 32a. The housing may be divided into an external housing 33 and an internal housing 37.

The external housing 33 is open at an upper side thereof and includes a cavity 331 for receiving an LED chip 34.

Further, the external housing 33 may be formed thereon with a mounting hole 36 in consideration of mounting a lens part (not shown). The cavity 331 may be provided therein with an encapsulation material (not shown) which entirely encapsulates the internal housing 37. The encapsulation material may be formed of a light-transmitting resin, for example, silicone resin or epoxy resin.

The internal housing 37 is integrally formed with the external housing 33 by injection molding and has a lower height than the external housing 33. The internal housing 37 and the external housing 33 are configured to expose some of upper surfaces 311, 321 of the first and second lead frames 31, 32. In the present exemplary embodiment, the internal housing 37 is disposed inside the cavity 331 and the external housing 33 is disposed outside the cavity 331, to be connected to the internal housing 37. The external housing 33 and the internal housing 37 may be formed of, for example, PPA or epoxy.

The internal housing 37 includes a reinforcing portion 371, bridges 372, 373, and exposing portions 374, 375, and has a substantially cross shape.

The reinforcing portion 371 fills a space between the first and second lead frames 31, 32. In particular, as shown in FIG. 4, the reinforcing portion 371 surrounds the uplift portions 31a, 32a of the first and second lead frames 31, 32, and may be formed higher than the uplift portions 31a, 32a. Since the structure of the reinforcing portion 371 completely surrounds the uplift portions 31a, 32a and the reinforcing portion 371 is formed higher than the uplift portions 31a, 32a, physical strength at a portion dividing the first and second lead frames 31, 32 may be further enhanced and moisture absorption may be prevented.

The bridges 372, 373 extend from the reinforcing portion 371 and are connected to the external housing 33. In the present exemplary embodiment, a first bridge 372 extends from the reinforcing portion 371 to be disposed on a partial region of the first lead frame 31 and is connected to the external housing 33, and a second bridge 373 extends from the reinforcing portion 371 to be disposed on a partial region of the second lead frame 32 and is connected to the external housing 33.

The exposing portions 374, 375 partially expose upper surfaces 311, 321 of the first and second lead frames 31, 32. In the present exemplary embodiment, the first exposing portion 374 exposes a portion of the upper surface 311 of the first lead frame 31 within the first bridge 372 to provide a mounting area for the LED chip 34. The LED chip 34 is mounted on the portion of the upper surface 311 of the first lead frame 31 exposed by the first exposing portion 374. The mounted LED chip 34 is connected to one of exposed portions of the upper surface 321 of the second lead frame 32 via a first bonding wire W1, with the second bridge 373 interposed between the exposed portions of the upper surface 321.

Although the first exposing portion 374 is illustrated as having a rectangle shape with rounded corners in the present exemplary embodiment, the first exposing portion 374 may alternatively have any shape in consideration of the shape and size of the LED chip 34 so long as the LED chip 34 can be mounted at the center of the first exposing portion 374. Further, in addition to the first exposing portion 374, other portions of the upper surface 311 of the first lead frame 31 may be exposed with the first bridge 372 interposed therebetween, and may be used as a mounting area or a bonding area.

The first exposing portion 374 may have an inclined inner wall to reflect light emitted from the LED chip 34. Further, the first exposing portion 374 is provided with an internal encapsulation material (not shown) which covers the LED chip 34 and may be formed of a light-transmitting resin containing at least one phosphor.

The internal housing 37 is formed therein with the second exposing portion 375 through the reinforcing portion 371 and the second bridge 373 to provide a bonding area.

A Zener diode ZD may be mounted on the other exposed portion of the upper surface 321 of the second lead frame 32, with the second bridge 373 interposed between the exposed portions of the upper surface 321, and a second bonding wire W2 for electrically connecting the Zener diode ZD to the first lead frame 31 is bonded to the bonding area provided by the second exposing portion 375. The Zener diode ZD is to protect the LED chip 34 from electrostatic discharge.

The second exposing portion 375 allows the Zener diode ZD to be electrically connected to the first and second lead frames 31, 32 via the second boding wire W2 without crossing the first bonding wire W1.

Referring to FIG. 3(c), a bottom surface 330 of the LED package 3 includes bottom surfaces of the external housing 33 and the internal housing 37, and is parallel with lower surfaces 312, 322 of the first and second lead frames 31, 32 excluding the uplift portions 31a, 32a. The bottom surface 330 of the LED package 3 may be coplanar and flush with lower surfaces 312, 322 of the first and second lead frames 31, 32. Accordingly, heat from the LED chip 34 may be discharged through the lower surfaces 312, 322 of the first and second lead frames 31, 32, thereby improving heat dissipation efficiency from the LED package.

According to the exemplary embodiments of the present invention, the LED package includes a housing configured to surround uplift portions formed on lead frames electrically connected to an LED chip. The LED package is to increase a heat dissipation area while increasing physical strength between the lead frames and preventing moisture absorption. Particularly, a reinforcing portion filling a space between the lead frames may increase physical strength between the lead frames.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiment without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light emitting diode (LED) package, comprising:
   an LED chip;
   a first lead frame and a second lead frame electrically connected to the LED chip, the first lead frame and the second lead frame respectively comprising a first uplift portion and a second uplift portion on facing regions thereof; and
   a housing supporting the first lead frame and the second lead frame, a first side of the housing exposed to the outside,
   wherein the first lead frame and the second lead frame each comprise a first side parallel to the first side of the housing and a second side opposite to the first side,
   wherein the housing comprises an external housing and an internal housing exposing at least a first portion of the first lead frame or the second lead frame,
   wherein the frame structure surrounds the internal housing,
   wherein the external housing comprises a frame structure and a cavity having a sidewall, and the internal housing is disposed inside the cavity, and
   wherein the internal housing extends from the frame structure across the cavity and is disposed on a second portion of the first lead frame and the second lead frame across the cavity.

2. The LED package of claim 1, wherein the internal housing comprises a first opening portion and a second opening portion exposing a portion of the first lead frame.

3. The LED package of claim 2, wherein the internal housing comprises a reinforcing portion filling a space between the first lead frame and the second lead frame.

4. The LED package of claim 3, wherein the internal housing comprises a bridge extending from the reinforcing portion, the bridge being connected to the external housing.

5. The LED package of claim 4, wherein first and second opening portions are disposed in the bridge.

6. The LED package of claim 2, wherein the first opening portion comprises a mounting area, the LED chip being arranged in the mounting area.

7. The LED package of claim 2, wherein the first opening portion comprises a rectangle shape in a plan view.

8. The LED package of claim 2, wherein the LED chip is arranged at a center portion of the first opening portion.

9. The LED package of claim 2, further comprising a light-transmitting resin comprising a phosphor disposed in the first opening portion.

10. The LED package of claim 2, wherein the second opening portion exposing a bonding area on the first lead frame.

11. The LED package of claim 10, further comprising a Zener diode arranged on the second lead frame and electrically connected to the first lead frame of the bonding area.

12. The LED package of claim 1, further comprising a light-transmitting resin arranged on the internal housing.

13. The LED package of claim 1, wherein the external housing and the internal housing are integrally formed.

14. The LED package of claim 1, wherein the height of the internal housing is lower than the height of the external housing.

15. The LED package of claim 1, wherein the first side of the first lead frame and the first side of the second lead frame are coplanar with the first side of the housing.

16. The LED package of claim 1, further comprising a lens part arranged on the external housing.

17. The LED package of claim 1, wherein the first uplift portion and the second uplift portion are respectively formed by a stamping process.

18. The LED package of claim 1, wherein the first uplift portion comprises the bonding area.

19. The LED package of claim 2, wherein the first opening portion is spaced apart from the second opening portion.

20. The LED package of claim 1, wherein the internal housing is disposed at an inner side of the external housing.

21. The LED package of claim 1, wherein the second portion is covered by the internal housing.

22. The LED package of claim 1, wherein the second portion is disposed parallel with the at least one first portion.

* * * * *